US006733591B2

(12) United States Patent  (10) Patent No.: US 6,733,591 B2
Anderson  (45) Date of Patent: May 11, 2004

(54) METHOD AND APPARATUS FOR PRODUCING GROUP-III NITRIDES

(75) Inventor: Tim Anderson, Gainesville, FL (US)

(73) Assignee: University of Florida Research Foundation, Inc., Gainesville, FL (US)

(*) Notice: Subject to any disclaimer, the term of this patent is extended or adjusted under 35 U.S.C. 154(b) by 0 days.

(21) Appl. No.: 09/735,217

(22) Filed: Dec. 12, 2000

(65) Prior Publication Data

US 2003/0024475 A1 Feb. 6, 2003

Related U.S. Application Data

(62) Division of application No. 09/336,286, filed on Jun. 18, 1999, now Pat. No. 6,218,280.
(60) Provisional application No. 60/089,906, filed on Jun. 18, 1998, and provisional application No. 60/124,252, filed on Mar. 12, 1999.

(51) Int. Cl.[7] .............................................. C23C 16/00

(52) U.S. Cl. ...................................................... 118/715

(58) Field of Search .......................... 118/715, 719, 118/722, 726, 900; 438/46, 604, 605, 607, 608, 779, 787; 257/76, 103, 615

(56) References Cited

U.S. PATENT DOCUMENTS 5,625,202 A  4/1997 Chai
6,274,518 B1 * 8/2001 Yuri et al. ................... 438/791
6,533,874 B1 * 3/2003 Vaudo et al. ............... 148/33.5

FOREIGN PATENT DOCUMENTS

EP  0846791  10/1998
WO  WO-99-66565  * 12/1999  ........... H01L/33/00

OTHER PUBLICATIONS

"The effect of surface nitridation of LiGaO2 substrates on the quality of MOVPE GaN", Kryoiouk et al., The 1997 Joint International meeting, Paris, Aug. 31–Sep. 5, 1997, Electrochemical Society, abstract No. 1830, p. 2104.*
"Dislocation distribution and subgrain of GaN films deposited on Sapphire by HVPE and MOVPE", Dunn et al., Mat. Res. Soc. Symp. Proc. vol. 482, pp. 417–422, Dec. 1–5, 1997.*

(List continued on next page.)

*Primary Examiner*—Evan Pert
*Assistant Examiner*—Lisa Kilday
(74) *Attorney, Agent, or Firm*—Saliwanchik, Lloyd & Saliwanchik

(57) ABSTRACT

The subject invention pertains to a method and device for producing large area single crystalline III–V nitride compound semiconductor substrates with a composition $Al_xIn_yGa_{1-x-y}N$ (where $0 \leq x \leq 1$, $0 \leq y \leq 1$, and $0 \leq x+y \leq 1$). In a specific embodiment, GaN substrates, with low dislocation densities (~$10^7$ cm$^2$) can be produced. These crystalline III–V substrates can be used to fabricate lasers and transistors. Large area free standing single crystals of III–V compounds, for example GaN, can be produced in accordance with the subject invention. By utilizing the rapid growth rates afforded by hydride vapor phase epitaxy (HVPE) and growing on lattice matching orthorhombic structure oxide substrates, good quality III–V crystals can be grown. Examples of oxide substrates include $LiGaO_2$, $LiAlO_2$, $MgAlScO_4$, $Al_2MgO_4$, and $LiNdO_2$. The subject invention relates to a method and apparatus, for the deposition of III–V compounds, which can alternate between MOVPE and HVPE, combining the advantages of both. In particular, the subject hybrid reactor can go back and forth between MOVPE and HVPE in situ so that the substrate does not have to be transported between reactor apparatus and, therefore, cooled between the performance of different growth techniques.

15 Claims, 10 Drawing Sheets

OTHER PUBLICATIONS

"GaN substrates: growth and characterization", Kryliouk et al., 3rd international Conference on Nitride Semiconductors, Montpellier, France, Jul. 4–9, 1999. Physica–Status–Solidi–A (Germany), vol. 176, No. 1, pp. 407–410, Nov. 16, 1999.*

"Thermal stability of MOCVD and HVPE GaN layers in H2, HCI, NH3 and N2", Mastro et al, Fourth International Conference on Nitride Semiconductors, Denver, CO, USA, Jul. 16–20, 2001. Physica–Status–Solidi–A (Germany), vol. 188, No. 1, pp. 467–471, Nov. 16, 2001.*

"Large area GaN substrate", Kryliouk et al., 4th Intl. Workshop on expert evaluation and control of semiconductor materials and technologies (EXMATEC 98), Cardiff, UK Jun. 22–24, 1998.*

"Growth of GAN single crystal substrate", Kryliouk et al., Materials Science Engineering, vol. 59, No. 1–3, pp. 6–11, Jun. 5, 1999.*

"GaN grown by H–MOVPE on lattice–matched oxide and silicon substrates", Mastro et al., Materials Science Forum, vol. 389–93, pt. 2, pp. 1473–1476, 2002.*

Ban, Vladimir S., "Mass Spectrometric Studies of Vapor–Phase Crystal Growth", *J. Electrochem. Soc.: Solid–State Science and Technology,* Jun. 1972, pp. 761–764, vol. 119, No. 6.

Ban, Vladimir S., "Mass Spectrometric and Thermodynamic Studies of the CVD of Some III–V Compounds", *Journal of Crystal Growth,* 1972, pp. 19–30, vol. 17, North–Holland Publishing Co.

S. Nakamura, M. Senob, S. Nagahama, N. Iwasa, et al., "Continuous–wave operation of InGaN/GaN/AIGaN–based laser diodes grown on GaN substrates" 1998 *Appl. Phys. Lett.,* 72, 16, 2014.

J.C. Zolper, R.J., Shul, A.G. Baca, R.G. Wilson, S.J. Pearton, R.A. Stall, "Ion–Implanted GaN junction field effect transistor" 1996 *Appl. Phys. Lett.,* 68, (16).

H. Morkoc, S. Strite, G.B. Gao, M.E. Lin, B. Sverdlov and M. Burns, "Large–band–gap SIC, III–V nitride, and II–VI ZnSe based semiconductor device technologies" 1994 *J. Appl. Phys.* 76, 1367.

T.P. Chow and Tyagi, "Wide Bandgap Compound Semiconductors for Superior High–Voltage Unipolar Power Devices" 1994 IEEE Trans. Electron Devices,,41, 1481.

Grzegory, J. Jun., S. Kurowski, M. Bockowski, and S. Porowski, "Crystal Growth of III–N compounds under high nitrogen pressure" 1993 Physica B, 185, 99.

Yu, V. Melnik, K.V. Vassilevski, I.P. Nikitina, A.I. Babanin, V. Yu, Davydov, V.A. Dmitriev, "Physical Properties of Bulk GaN Crystals Grown by HVPE" 1997 MIJ–NSR, vol. 2, Art. 39.

O.M. Kryliouk, T.W. Dann, T.J. Anderson, G.P. Maruska, L.D. Zhu, T.J. Daly, M. Lin, P. Norris, H.T. Chai, D.W. Kisker, J.H. Li, K.S. Jones "MOCVD Growth of GaN Films on Lattice–Matched Oxide Substrates" 1997 Mat. Res. Soc. Sym. Proc. vol. 449 Materials Research Society.

Olga Kryliouk, Mike Reed, Todd Dann, Tim Anderson, Bruce Chai, "Growth of GaN single crystal substrates" 1999 Materials Science and Engineering B59 (1999) 6–11.

Shuji Nakamura, "InGaN/GaN/AIGaN–Based Laser Diodes with an Estimated Lifetime of Longer Than 10,000 Hours" 1998 MRS Bulletin.

* cited by examiner

METHOD AND APPARATUS FOR PRODUCING GROUP-III NITRIDES

CROSS-REFERENCE TO RELATED APPLICATIONS

This is a divisional of U.S. Ser. No. 09/336,286, filed Jun. 18, 1999 now U.S. Pat. No. 6.2 18.280, which claims priority from provisional application U.S. Ser. No. 60/089,906, filed Jun. 18, 1998; and from provisional application U.S. S No. 60/124,252 filed Mar. 12, 1999.

The subject invention was made with government support under a research project supported by DARPA Grant No. N00014-92-J-1895 and the Office of Air Force Grant No. AF97-056. The government has certain rights in this invention.

BACKGROUND OF THE INVENTION

The group-III nitrides, for example GaN, are promising wide band-gap semiconductors for optical devices in the blue and ultraviolet (S. Nakamura, 1997a, 1998b), high-temperature and high-power device applications (H. Morkos et al, 1994; T. P. Chow et al., 1994, J. C. Zolper et al., 1996).

However, the reliability of current state-of the art GaN-based devices such as blue emitter and high-temperature devices is limited. Blue diode laser lifetimes are short. This is widely attributed to the fact that most GaN devices are grown on lattice mismatched substrates such as sapphire which results in high dislocation densities, typically about $10^{10}$ cm$^{-2}$.

Epitaxial GaN films have recently attracted much interest based on their optoelectronic applications as blue-ultraviolet optoelectronic devices and high temperature transistors (S. Nakamura, 1997, 1998). Since bulk GaN substrates are not available currently, the films are generally grown on sapphire, SiC, GaAs, or Si substrates. These substrates provides poor lattice and thermal expansion matching to GaN which lead to very high densities of structural defects. The identification of an appropriate matched substrate for epitaxial growth might enable the preparation of high quality devices with these semiconductor materials.

One growth process for preparing single crystal films of GaN relies on the vapor phase reaction between GaCl$_3$ and NH$_3$ in a hot-walled reactor, such as a halide vapor phase epitaxy (HVPE) system. Sapphire substrates are often used because they are readily available. However, since sapphire is not lattice matched to GaN, GaN and sapphire have very different thermal expansion coefficients. Accordingly, the resulting GaN has poor crystalline quality, having high dislocation densities and other lattice imperfections. Even so, growth of GaN on sapphire is still common. Furthermore, attempts have been made to reduce the occurrence of these dislocations and other lattice imperfections by providing buffer layers, such as AlN or ZnO, between the sapphire and the GaN. However, the defects from the substrate mismatch propagate through the buffer layers to the GaN film.

Though the first demonstration of the fabrication of single crystal GaN occurred 30 years ago, interest in these materials for real-world optoelectronic devices has grown only in the last 5–6 years as material quality has improved and controllable p-type doping has finally been achieved.

A primary difficulty in producing high quality GaN single crystal has been the lack of lattice matching substrates such that high quality GaN single crystal epitaxial films could not be produced. Since high quality bulk GaN substrates have not been available, GaN films are generally grown on sapphire, SiC, or Si substrates. However, III–V nitride compounds having the wurtzite structure which is hexagonal in symmetry, in general, have much smaller lattice constants (a-axis dimension=3.104 Å for AlN, 3.180 Å for GaN and 3.533 for InN) as compared to the currently available semiconductor substrates which typically have cubic symmetry. Accordingly, sapphire, SiC, and Si provide poor lattice, as well as thermal, matching to GaN which can lead to very high densities of structural defects.

The first blue GaN-based light emitting diodes (LEDs) and lasers, are now commercially available. They are fabricated from epitaxial GaN grown on sapphire substrates (S. Nakamura, 1997). The best published lifetime for a GaN-based laser on sapphire is only tens of hours, probably due to the high density of crystal defects. Recently a laser lifetime of 10,000 hours has been reported for devices fabricated on lateral overgrowth epitaxial material on patterned sapphire substrate (S. Nakamura, 1997a, 1998b, 1998c).

Apparently the GaN that laterally overgrows on the SiO$_2$ mask (in between the mask openings) has dislocation densities that are orders of magnitude lower than material grown directly on sapphire. Lasers fabricated in this low defect density material have much longer life time.

This epitaxially laterally overgrowth (ELOG) technique involves the growth of a GaN buffer layer on a substrate of, for example, Si, GaAs, Sapphire or SiC. A pattern of SiO$_2$, for example, stripes, is then grown on the GaN buffer layer. The SiO$_2$ are about 0.2 µm in thickness and preferably covers about two-thirds of the buffer layer. An example may have 6–8 µm wide SiO$_2$ stripes with 4 µm spacing. As the growth of GaN is continued, the GaN does not grow on the SiO$_2$ stripes but, rather, only in the grooves. As the GaN growth in the grooves reaches the height of the SiO$_2$ stripes, the GaN continues to grow up, but also begins to grow laterally from the sides of the GaN ridges to eventually form one continuous film. The defect density of the ELOG GaN film can be on the order of $10^7$/cm$^3$, with a reduced number of threading dislocations in GaN layer compared with GaN grown directly on the substrate without the SiO$_2$ stripes. The original substrate material can then be removed, for example via etching, but the SiO$_2$ grooves are still trapped inside the GaN material. Furthermore, removal of the original substrate can damage the GaN material.

Recently in GaN multi-quantum-well-structure laser diodes (LDs) grown on GaN substrates were demonstrated (S. Nakamura, et al., 1998). The LDs showed a lifetime longer than 780 h despite a large threshold current density. In contrast, the LDs grown on a sapphire substrate exhibited a high thermal resistance and a short lifetime of 200 h under room-temperature continuous-wave operation.

Because of high dissociation pressure of nitrogen over GaN (>70 kbar at 2300° C.), no one has succeeded in making large bulk GaN single crystal substrates. Currently, bulk crystals with dimensions of only a few millimeters can be obtained with high pressure synthesis (20 kbar and 1600° C.) (I. Grzegory et al., 1993) and by hydride vapor phase epitaxy (HVPE) on SiC or sapphire substrates with subsequent substrate removal by reactive ion etching, laser pulses, or by polishing. Accordingly, GaN is usually made by heteroepitaxy onto lattice mismatched substrates such as sapphire (S. Nakamura, 1997a) and silicon carbide (Yu V. Melnik et al., 1997) with subsequent substrate removal by reactive ion etching or wet chemical etching, by laser pulses or by polishing. Each of these removal procedures can cause residual strain, changes in chemical composition of epitaxial films, etc. In addition, not only are the lattice constant of the GaN film and substrate very different, but so are the thermal expansion coefficients, creating additional inducement for the creation of dislocations. These two factors, lattice constant mismatch and very different thermal expansion coefficients, can result in GaN epitaxial films with high densities of dislocations ($10^{10}$ cm$^{-2}$), regions of built-in strain, and cracks which often occur due to thermal stress during cooling.

This suggests that if low dislocation density bulk GaN substrates were available, device life times approaching the 50,000 target for reliable CD-ROM storage devices could readily be achieved. Similar improvements can be expected with respect to the reliability of other GaN-based devices such as heterojunction bipolar transistors and modulation-doped field effect transistors for high-temperature electronics and uncooled avionics.

BRIEF SUMMARY OF THE INVENTION

The subject invention pertains to a method and device for producing large area single crystalline III–V nitride compound semiconductor substrates with a composition $Al_xIn_yGa_{1-x-y}N$ (where $0 \leq x \leq 1$, $0 \leq y \leq 1$, and $0 \leq x+y \leq 1$). In a specific embodiment, a crystal GaN substrates with low dislocation densities (~$10^7$ cm$^{-2}$) can be produced. These substrates, for example, can be used to fabricate lasers and transistors. Large bulk single crystals of III–V compounds can be produced in accordance with the subject invention by, for example, utilizing the rapid growth rates afforded by hydride vapor phase epitaxy (HVPE) and growing on oxide substrates such as lithium gallate LiGaO$_2$ substrates. Lithium gallate has a close lattice mismatch (~1%) to GaN. LiGaO$_2$ has an orthorhombic structure with lattice parameters of a=5.402 Å, b=6.372 Å and c=5.007 Å. Bulk single crystals of LiGaO$_2$ can be grown from a melt by the Czochralski technique. Lithium gallate crystals were obtained from Crystal Photonics, Inc. and subsequently sliced and polished on both sides. A thin MOVPE (metal organic vapor phase epitaxy) GaN film can be grown on the lithium gallate substrates to protect the oxide substrate from attack by HCl during HVPE. The oxide substrate can be self-separated from the GaN film after special substrate treatment procedure and cooling process. Examples of oxide substrates include LiGaO$_2$, LiAlO$_2$, MgAlScO$_4$, Al$_2$MgO$_4$, and LiNdO$_2$. In a specific embodiment, AlN can be grown on LiAlO$_2$, preferably after surface nitridation.

The subject invention also relates to an apparatus which can alternately perform MOVPE and HVPE, without removing the substrate. This eliminates the need to cool the substrate between the performance of the different growth techniques. The subject invention can utilize a technique for the deposition of GaN which can alternate between MOVPE and HVPE, combining the advantages of both. In this process, during HVPE, trimethylgallium (TMG) can first be reacted with HCl in the source zone of the hot wall reactor (see FIG. 1A) to form chlorinated gallium species. For example, TMG and HCl can be reacted according to the following reaction:

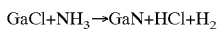

Preferably, the methyl radicals can be converted to methane gas such that negligible carbon is incorporated in the GaN films. The stream can then be combined with NH$_3$ in the downstream mixing zone and directed toward a substrate where deposition of GaN occurs. For example, the stream can be combined with NH$_3$ resulting in GaN deposition in accordance with the following reaction:

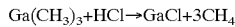

The advantages of this technique include: the ability to deposit GaN by either MOVPE or HVPE in the same reactor, high growth rates, rapid reactant switching, lower background impurities with HCl (the Cl retains metal impurities in the vapor phase), in-situ etching, elimination of HVPE source problems and finally improvement of NH$_3$ cracking.

Preferably, LiGaO$_2$ substrate nitridation is utilized for GaN film/LiGaO$_2$ substrate self-separation which can cause the GaN film to "lift off" the substrate, such that substrate removal in HCl by wet chemical etching is not needed.

Changes in the surface morphology, chemical composition and crystal structure of the (001) LiGaO$_2$ substrate as a function of nitridation agent, temperature and time, and showed the influence of surface morphology of the nitrided layer on the subsequent growth of GaN films and film/substrate self-separating.

The subject invention relates to a method for producing III–V nitride compound semiconductor substrates, comprising the steps of: growing a first III–V nitride compound semiconductor onto an oxide substrate by MOVPE; and growing an additional III–V nitride compound semiconductor by HVPE onto the first III–V nitride compound semiconductor grown by MOVPE. This method can be utilized to grow a first and additional III–V nitride compound semiconductors each having a composition given by $Al_xIn_yGa_{1-x-y}N$ (where $0 \leq x \leq 1$, $0 \leq y \leq 1$, and $0 \leq x+y \leq 1$). The first and the additional III–V nitride compound semiconductors can have different compositions or each have the same composition. The oxide substrate can have an orthorhombic structure with a good lattice match to the first III–V nitride compound semiconductor. For example, the oxide substrate can be selected from the group consisting of LiGaO$_2$, LiAlO$_2$, MgAlScO$_4$, Al$_2$MgO$_4$, and LiNdO$_2$. Preferably, the oxide substrate has a surface area for III–V nitride compound semiconductor growth of at least 10×10 mm$^2$.

In a preferred embodiment, the first and the additional III–V nitride compound semiconductors are both GaN. At least 0.2 μm of GaN can be grown during the MOVPE growth step. The step of growing GaN onto the LiGaO$_2$ substrate by MOVPE can be conducted in a low pressure horizontal cold-wall MOCVD reactor with triethylgallium (TEGa) and ammonia (NH$_3$) as precursors and N$_2$ as a carrier gas.

Advantageously, the oxide substrate, for example the LiGaO$_2$ substrate, can be maintained at an elevated temperature between the step of growing GaN by MOVPE and the step of growing GaN by HVPE. Also, the step of growing GaN by MOVPE and the step of growing GaN by HVPE can each take place in the same reactor.

The MOVPE grown GaN can serve to protect the LiGaO$_2$ substrate from attack by HCl during the HVPE growth of GaN. If desired, additional GaN can be grown by MOVPE onto the GaN grown by HVPE, producing a high quality surface. After the final layer is grown, the GaN can be cooled in for example nitrogen flow, to room temperature. The step of growing additional GaN by HVPE can involve the step of first reacting trimethylgallium (TMG) with HCl in a source zone of a hot wall reactor to form a stream comprising a chlorinated gallium species. For example, the TMG can be reacted with HCl according to the following reaction:

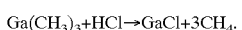

Preferably, the methyl radicals are converted to methane gas such that neglible carbon is incorporated in the GaN. The step of growing additional GaN by HVPE can further involve the step of combining the stream with $NH_3$ in a downstream mixing zone and directing the stream toward the GaN grown by MOVPE on the substrate where growth of additional GaN can occurs. Upon combining the stream with $NH_3$ the deposition of GaN can occur. For example, the stream can be combined with $NH_3$ resulting in GaN deposition in accordance with the following reaction:

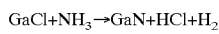

$$GaCl+NH_3 \rightarrow GaN+HCl+H_2$$

After the step of growing additional GaN by HVPE the $LiGaO_2$ can be removed from the GaN by, for example, wet chemical etching. Preferably, the GaN can be lifted off the $LiGaO_2$ substrate. In a preferred embodiment, prior to the growth of GaN onto a $LiGaO_2$ substrate by MOVPE, nitridation of the $LiGaO_2$ substrate can be performed. This substrate nitridation can cause a reconstruction of the substrate surface and the formation of a thin layer of nitrided material having the same orientation as the substrate. This substrate nitridation can involve the steps of: heating the substrate in the presence of nitrogen; and exposing a surface of the substrate to $NH_3$. Preferably the substrate is heated for a period of time ranging from about 10 minutes to 15 minutes in a temperature range of about 800° C. to about 850° C., and the substrate surface is exposed to $NH_3$ for a period of time ranging from about 30 seconds to about 10 minutes in a temperature range of about 800° C. to about 900° C.

After growing additional GaN by HVPE, the $LiGaO_2$ substrate and the GaN can be separated. This separation can be accomplished by the application of mechanical force such that the GaN lifts off of the $LiGaO_2$ substrate. After the GaN is separated from the $LiGaO_2$ substrate, the $LiGaO_2$ can then be reused to grow additional GaN.

The subject method can be used to produce a large area free standing GaN crystal, having a dislocation density less than $10^8$ cm$^{-2}$. The surface area of these crystals can be at least $10^{-4}$ m$^2$, and have been as large as a 2 inch diameter circular wafer. In a specific embodiment, a GaN crystal has been produced with a dislocation density less than $10^7$ cm$^{-2}$ and a useable substrate area greater than $10^{-2}$ m$^2$.

The subject invention also relates to a method of preparing the surface of an oxide substrate, comprising the steps of: heating an oxide substrate in the presence of nitrogen; exposing a surface of the oxide substrate to $NH_3$. This method is applicable to oxide substrates such as $LiGaO_2$, $LiAlO_2$, $MgAlScO_4$, $Al_2MgO_4$, and $LiNdO_2$. The oxide substrate, for example $LiGaO_2$, can be heated for a period of time ranging from about 10 minutes to about 12 minutes in a temperature range of about 800° C. to about 850° C. The surface of the oxide substrate can be exposed to $NH_3$ for a period of time ranging from about 30 seconds to about 10 minutes in a temperature range of about 800° C. to about 900° C. The substrate can be heated in the presence of nitrogen, for example flowing $N_2$ over the oxide surface at a flow rate in the range from about 2 L/min to about 5 L/min. This method can improve the smoothness of the surface of the oxide substrate.

The subject invention also pertains to a device for producing GaN crystals having a means for performing metal organic vapor phase epitaxy (MOVPE) on the surface of the substrate and a means for performing hydride vapor phase epitaxy (HVPE) on a surface of a substrate. The device can transition from MOVPE to HVPE in situ.

Advantageously, the substrate does not have to be removed from the device between MOVPE and HVPE and, therefore, the substrate can be maintained at elevated temperatures during transition from MOVPE to HVPE.

DETAILED DISCLOSURE OF THE INVENTION

Figure 1A:
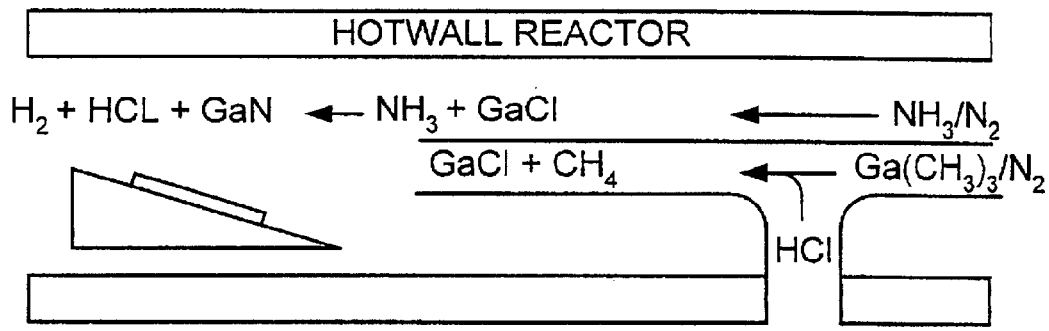
FIG. 1A illustrates schematically an H-MOVPE reactor in accordance with the subject invention.

The subject invention pertains to a method and device for producing large area single crystalline III–V nitride compound semiconductor substrates with a composition $Al_xIn_yGa_{1-x-y}N$ (where $0 \leq x \leq 1$, $0 \leq y \leq 1$, and $0 \leq x+y \leq 1$). In a specific embodiment, GaN substrates, with low dislocation densities (~$10^7$ cm$^2$) can be produced. These crystalline III–V substrates can be used to fabricate lasers and transistors. Large area free standing single crystals of III–V compounds, for example GaN, can be produced in accordance with the subject invention. By utilizing the rapid growth rates afforded by hydride vapor phase epitaxy (HVPE) and growing on lattice matching orthorhombic structure oxide substrates, good quality III–V crystals can be grown. Examples of oxide substrates include $LiGaO_2$, $LiAlO_2$, $MgAlScO_4$, $Al_2MgO_4$, and $LiNdO_2$.

In a preferred embodiment, lithium gallate ($LiGaO_2$) substrates can be utilized to grow good quality GaN crystals. In a specific embodiment, lithium gallate has a close lattice mismatch (~1%) to GaN. $LiGaO_2$ has an orthorhombic structure with lattice parameters of a=5.402 Å, b=6.372 Å and c=5.007 Å. Bulk single crystals of $LiGaO_2$ can be grown from a melt by the Czochralski technique. In a specific embodiment, lithium gallate crystals were obtained from Crystal Photonics, Inc. and subsequently sliced and polished on both sides. A thin GaN film can be grown, for example by MOVPE (metal organic vapor phase epitaxy), on the lithium gallate substrates. This GaN film can act to protect the oxide substrate from attack by HCl during growth of a thicker GaN film by, for example, HVPE. The oxide substrate can be subsequently self-separated from the GaN film after special substrate treatment procedure and cooling process. Alternatively, the oxide substrate can be removed by other well known techniques such as wet chemical etching. Additional III–V nitride materials which can be grown via the subject method include, for example, AlN and InN.

If desired, the substrate can be moved back and forth between MOVPE and HVPE growing apparatus, while maintaining the substrate is an appropriate environment. The subject invention also relates to a method and apparatus, for the deposition of III–V compounds, which can alternate between MOVPE and HVPE, combining the advantages of both. In a preferred embodiment, a hybrid reactor in accordance with the subject invention can go back and forth between MOVPE and HVPE in situ so that the substrate does not have to be transported between reactor apparatus. Preferably, this hybrid reactor allows both the MOVPE and HVPE growth to occur in a hot-wall reactor.

In a specific embodiment, the subject method and apparatus can be utilized for the deposition of GaN. Preferably, a thin layer of GaN is first grown on the substrate via MOVPE. Although, the entire thick film of GaN can be grown by MOVPE, MOVPE is much slower than HVPE and, therefore, more time consuming for growing a thick film. Accordingly, HVPE can be used to grow GaN on top of the thin layer of GaN grown by MOVPE. Alternatively, the entire GaN layer can be grown by HVPE. In this process, during HVPE, trimethylgallium (TMG) can first be reacted with HCl in the source zone of the hot wall reactor (see FIG. 1A) to form chlorinated gallium species. For example, TMG and HCl can be reacted according to the following reaction:

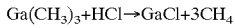

Preferably, essentially all methyl radicals are immediately converted to methane gas, such that essentially no carbon is incorporated in the GaN films. The stream can then be combined with NH$_3$ in the downstream mixing zone and passed over a substrate where deposition of GaN occurs. For example, the stream can be combined with NH$_3$ in accordance with the following reaction:

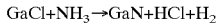

The advantages of this technique can include one or more of the following: the ability to perform MOVPE or HVPE growth in the same reactor, high growth rates, rapid reactant switching, lower background impurities with HCl (the Cl retains metal impurities in the vapor phase), in-situ etching, elimination of HVPE source problems, and improvement of NH$_3$ cracking.

Prior to the initial step of growing the III–V compound on the oxide substrate, the substrate can be treated to prepare the oxide surface for growth of the group-III nitride film. This treatment can enhance the ability to mechanically separate the oxide substrate from the III–V film after growth. Preferably, LiGaO$_2$ substrate nitridation is utilized prior to GaN growth, in order to enhance GaN film/LiGaO$_2$ substrate self-separation. Such nitridation can cause the GaN film to "peel off" the substrate, such that substrate removal in HCl by wet chemical etching is not needed. The use of a nitrogen carrier gas can be utilized to achieve high structural quality GaN on LiGaO$_2$. Furthermore, the nitridation of LiGaO$_2$, for example using NH$_3$ prior to growth, can improve the film quality. For the growth of thick GaN films it is a preferred step, and can enhance film-substrate self-separation. Nitridation of the LiGaO$_2$ substrate can lead to the reconstruction of the substrate surface and to the formation of a thin layer of nitrided material having the same orientation as the substrate. The nitridation is thought to supply nucleation centers to promote the growth of GaN through a decrease in the interfacial free energy between the film and substrate. The nitrided layer can also reduce the diffusion of Li into the GaN film.

Nitridation causes changes in the surface morphology, chemical composition and crystal structure of the oxide, for example (001) LiGaO$_2$, substrate as a function of nitridation agent, temperature and time. These changes in the surface morphology of the nitrided layer influence the subsequent growth of GaN films and film/substrate self-separating.

Figure 1B:
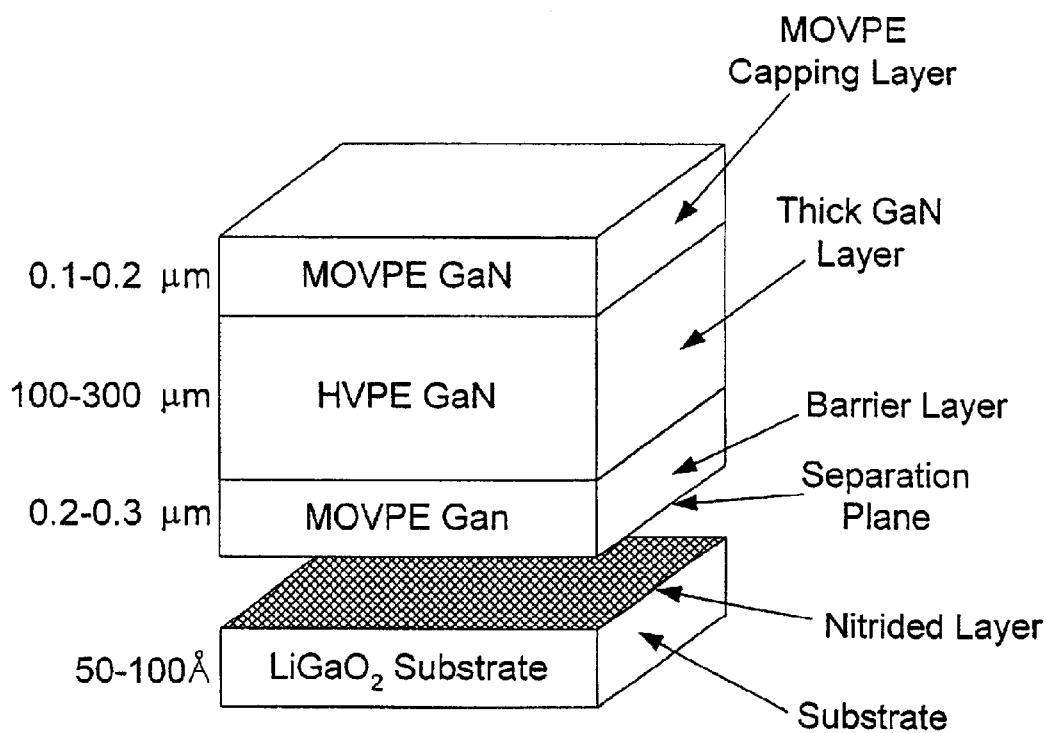
FIG. 1B shows a schematic structure of a sequence of layers which can be used to produce thick GaN films.

Referring to FIG. 1B, a schematic structure of a sequence of layers which can be used to produce thick GaN films is shown. Substrates can first be pre-heated in nitrogen, followed by a nitridation step using NH$_3$. Seed GaN crystals can be grown by MOVPE on (001)LiGaO$_2$ substrates to protect substrate from HCl attack. GaN layers can be grown on the nitrided surfaces at, for example, 850° C. and atmospheric pressure. MOVPE GaN film thickness of 0.2–0.3 μm can be grown first, followed by a thick GaN layer grown by HVPE. In a specific example, the HVPE grown GaN can be grown at 850–950° C. at HCl/Ga ratio of 2.0 and NH$_3$ flow 250 sccm. The estimated growth rate for HVPE is 50–70 μm/hr. Typical HVPE GaN thickness can range from 100 to 300 μm. If desired, as a last step, growth of a thin (0.1–0.2 μm) MOVPE GaN layer can be performed to improve the surface morphology of the growing film. Samples can be slowly cooled to room temperature in, for example, nitrogen flow. The LiGaO$_2$ substrate can be removed, for example by wet chemical etching. Alternatively, the LiGaO$_2$ substrate can be mechanically separated from the GaN film. The LiGaO$_2$ substrate nitridation and cooling processes are preferred to encourage film-substrate self-separation and cause the GaN film to "lift off" the LiGaO$_2$ substrate. The LiGaO$_2$ can then be reused to grow additional GaN crystals.

Figure 2:
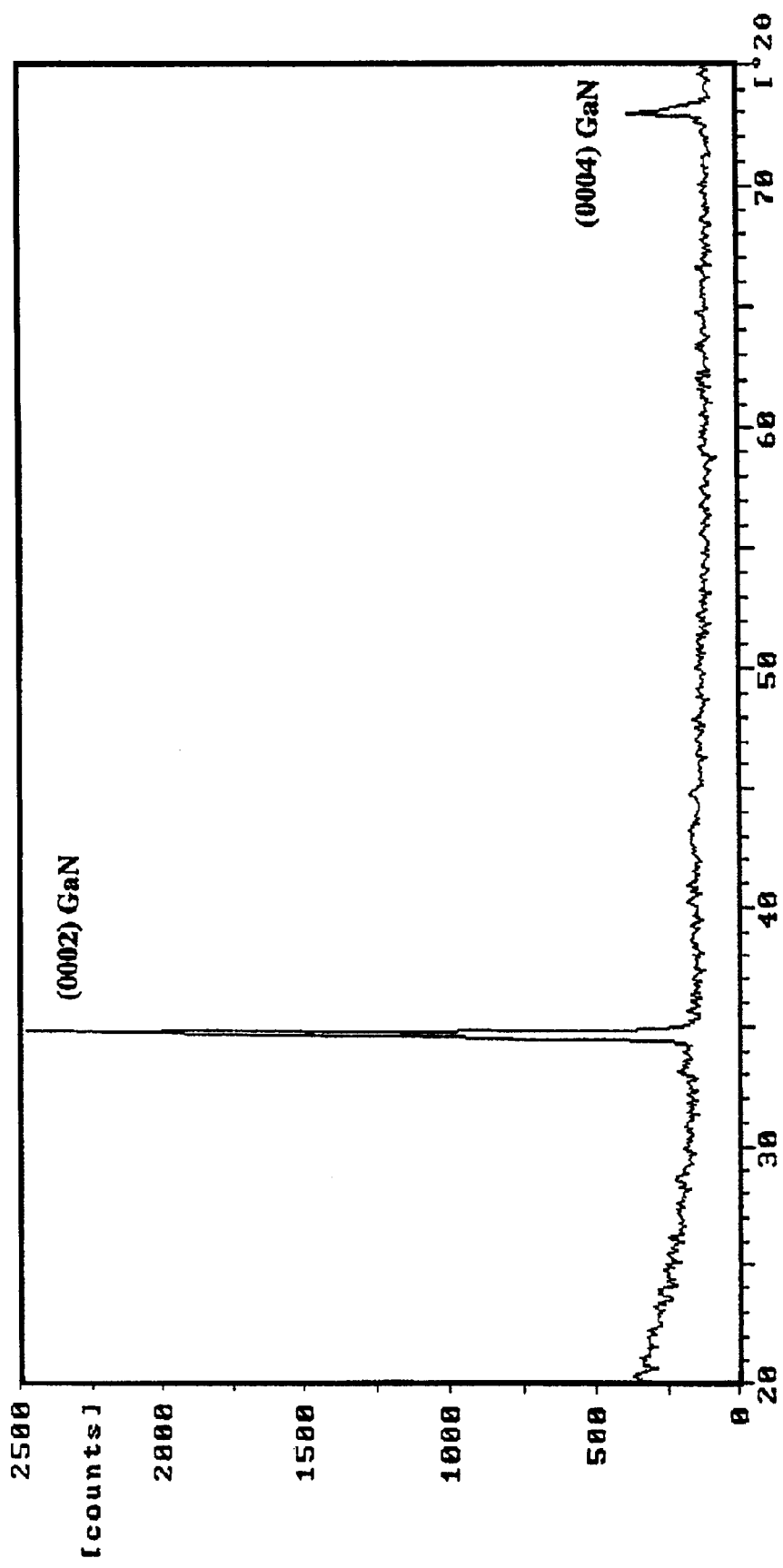
FIG. 2 shows the results of an XRD analysis which was performed on a free-standing GaN sample produced in accordance with the subject invention.

XRD was used to assess the crystallinity of thick GaN films grown in accordance with the subject invention. Referring to FIG. 2, only two peaks occurring at 2θ=34.67° and 2θ=73.01° may be indexed as the (0002) and (0004) diffraction peaks of GaN. Thus, single crystal (0001)—oriented hexagonal GaN growth on LiGaO$_2$ by H-MOVPE was observed.

Free-standing bulk GaN crystals with a size of 10×10×0.3 mm$^3$ were obtained without any mechanical or chemical treatment. In addition, 2 inch GaN substrates have also been grown in accordance with the subject invention.

GaN bulk crystals grown in accordance with the subject invention have shown a full width at half maximum (FWHM) ω-scan of 46.7 arc sec. Average values of FWHM for bulk GaN ranged from 100 to 300 arc sec.

Figure 3A:
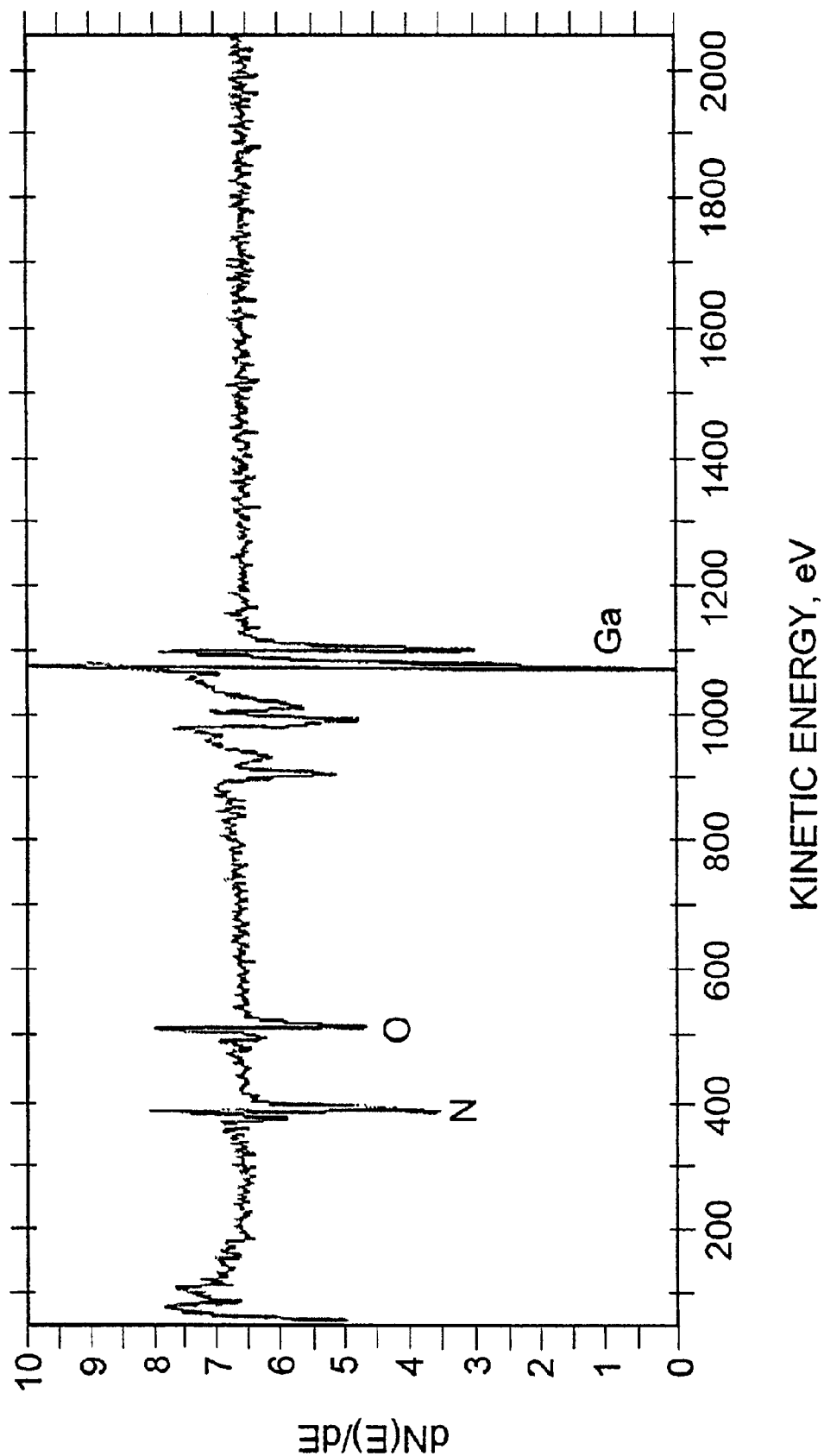
FIGS. 3A and 3B show auger electron spectroscopy (AES) spectra of a bulk single crystal GaN substrate from the top and the GaN/$LiGaO_2$ interface after separation, respectively.
Figure 3B:
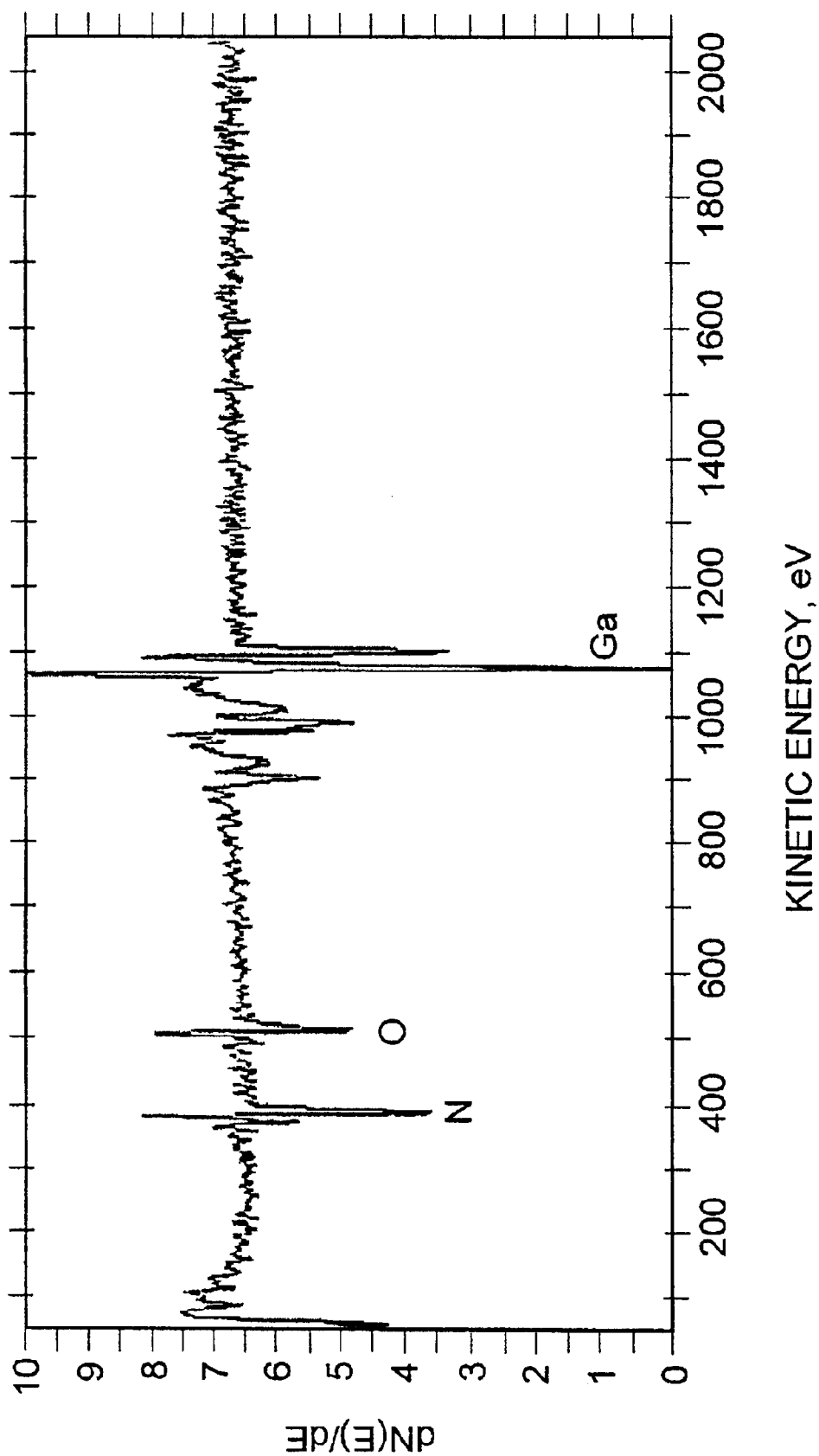
Figure 3C:
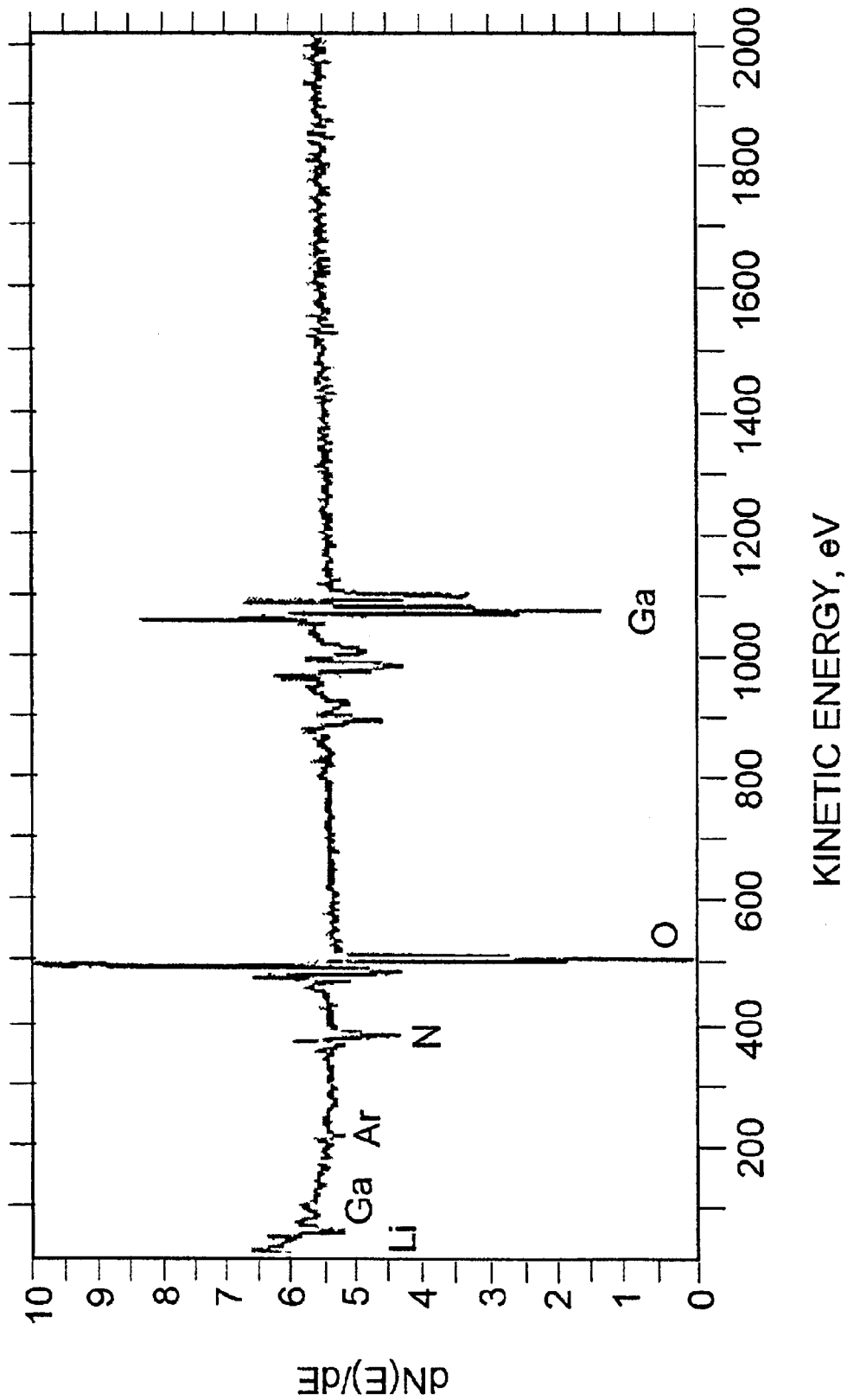
FIGS. 3C and 3D show AES spectra of a $LiGaO_2$ substrate before (after nitridation step) and after growth, respectively.
Figure 3D:
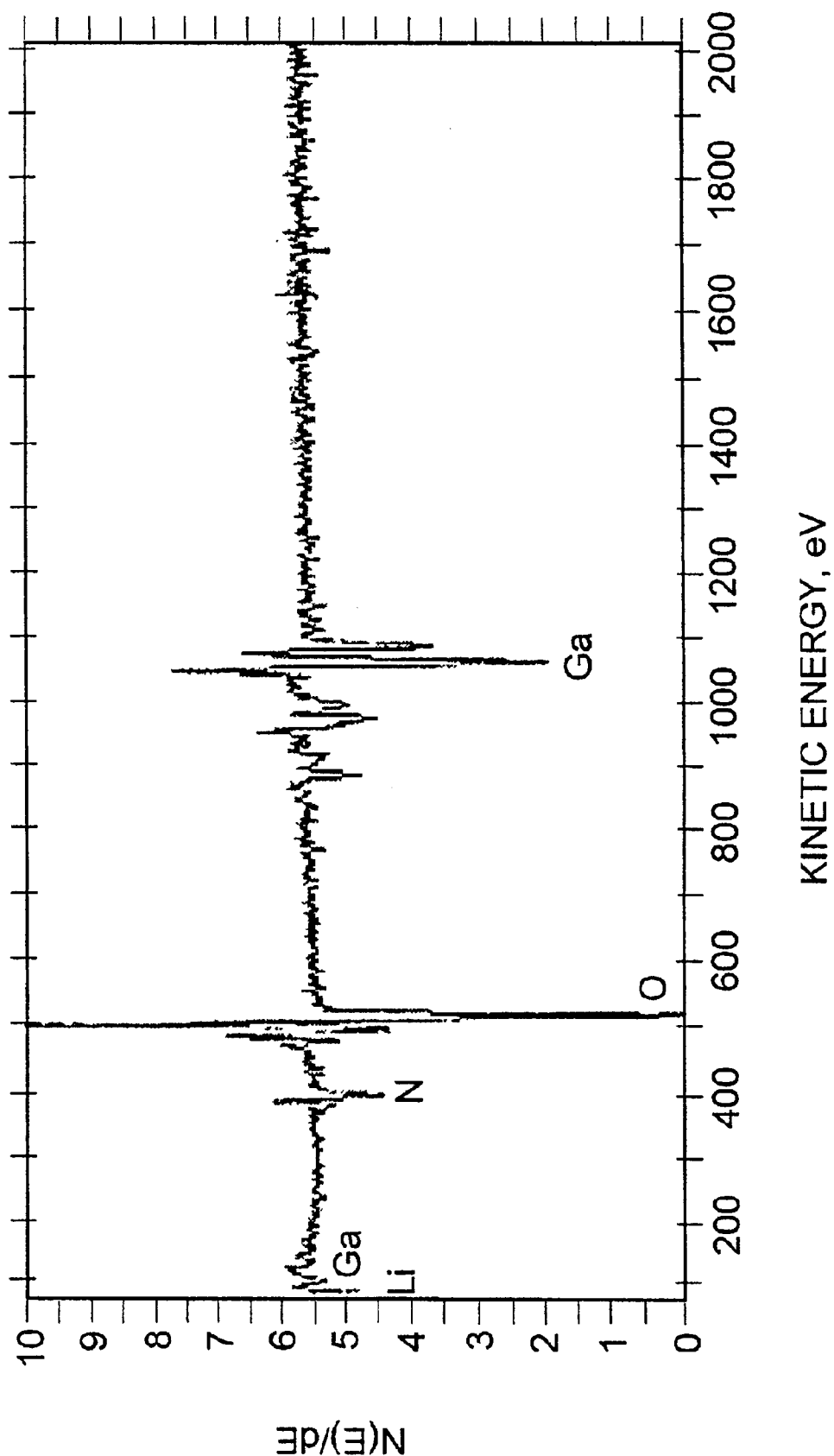
Figure 3E:
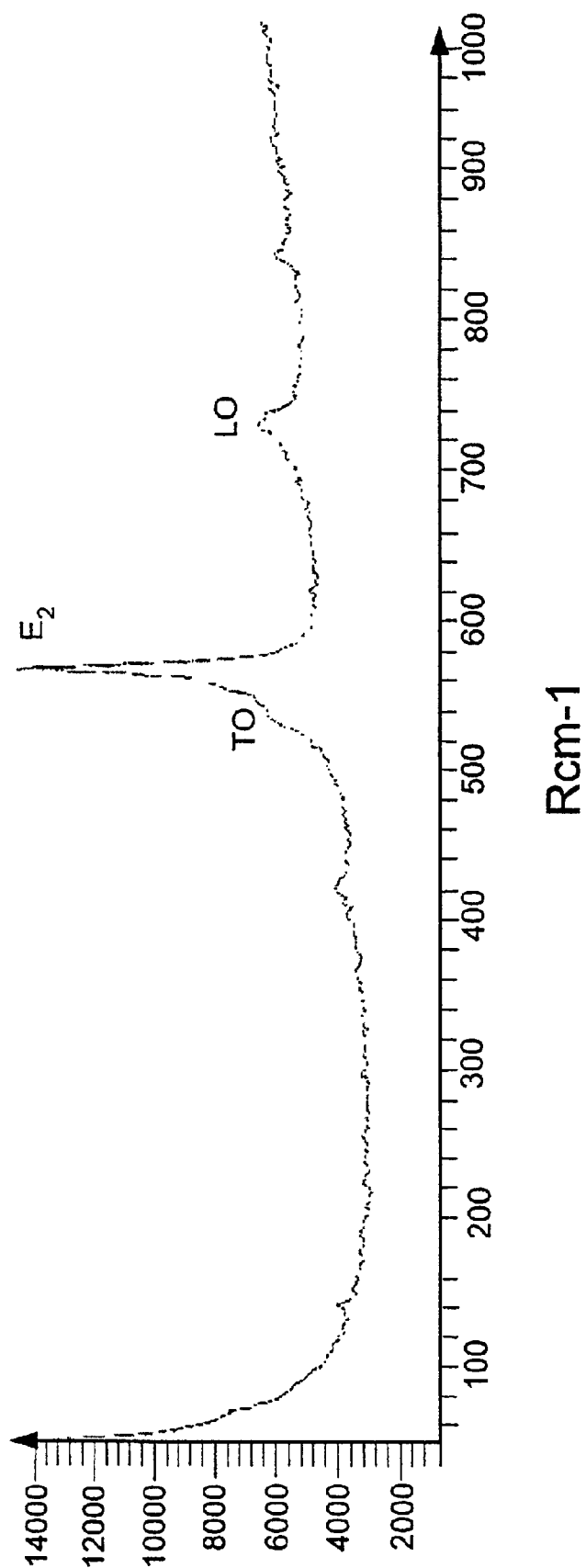
FIGS. 3E and 3F show micro Raman scattering spectra of a bulk single crystal GaN substrate from the top and the GaN/$LiGaO_2$ interface after separation, respectively.
Figure 3F:
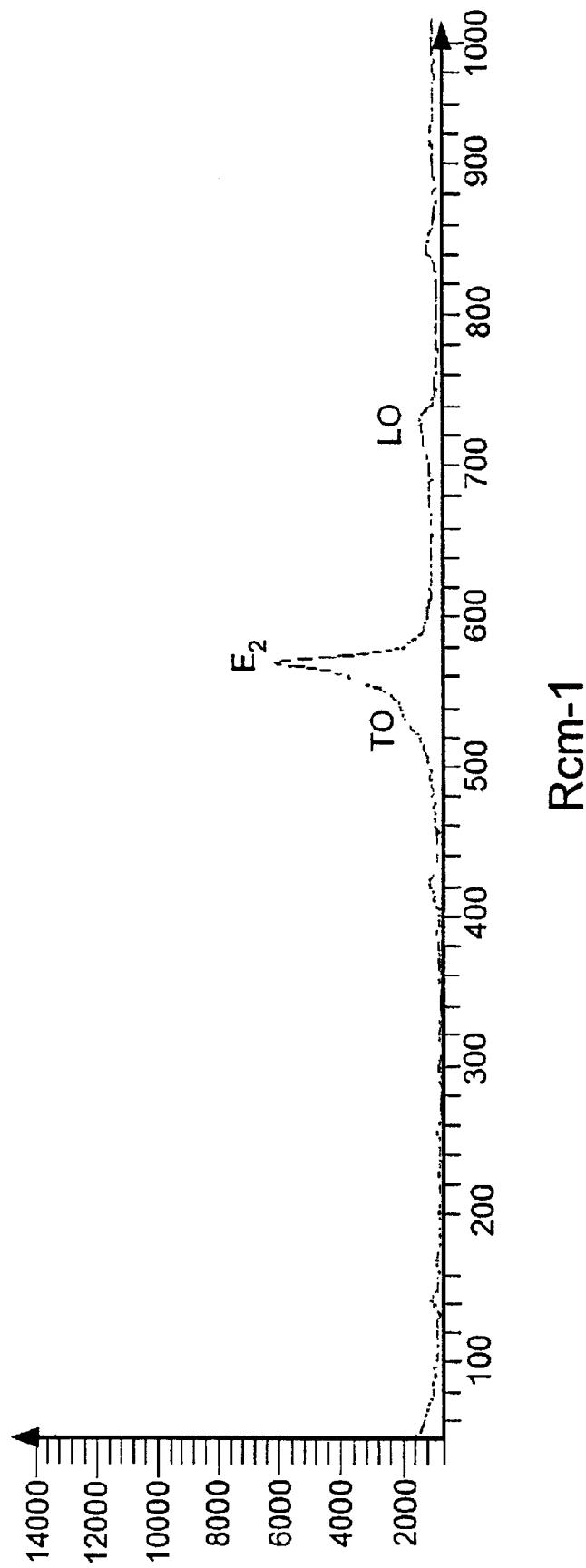

We investigated both sides (top and bottom) of a GaN crystal grown by the subject method. FIGS. 3A and 3B show auger electron spectroscopy (AES) spectra of a bulk single crystal GaN substrate from the top and from the GaN/LiGaO$_2$ interface after separation, respectively. The AES spectra appear to show essentially identical chemical composition on top of the film and at the film-substrate interface. No residual contamination was detected. FIGS. 3C and 3D show the AES spectra of the LiGaO$_2$ substrate before growth (after nitridation step) and after growth, respectively. These spectra are essentially identical as well. No trace of substrate decomposition was detected. It appears likely that separation occurs at the interface of the MOVPE GaN film and the nitrided layer of the LiGaO$_2$ substrate. FIGS. 3E and 3F show micro Raman scattering spectra of a bulk single crystal GaN substrate from the top and from the GaN/LiGaO$_2$ interface after separation, respectively. Based on micro Raman scattering measurements (Ar-ion laser 100 mw, 514 nm; 200 μm slit width) no shifting on the position of the most strain-sensitive phonon $E_2$ (570 cm−1) was detected. This corresponds to a residual-deformation free GaN crystal.

Surface morphology was examined by Atomic Force Microscopy (AFM), and the RMS roughness determined from the measurements was $R_g$=0.03 nm for the HVPE surface. Adding the top MOVPE layer reduced the surface roughness by an order of magnitude ($R_g$=0.03 nm). This illustrates the advantage of the last MOVPE GaN growth step.

We have demonstrated the H-MOVPE (hydride metal organic phase epitaxy) growth of thick (100–300 μm) GaN films on 10×10 mm$^2$ LiGaO$_2$ and removal of the film from the substrate. The GaN substrates grown have had a flat monocrystalline surface without any mechanical or chemical treatment. In addition, no cracks or residual stain were observed.

In a specific embodiment, the GaN films can be deposited in a low pressure horizontal cold-wall MOCVD reactor with triethylgallium (TEGa) and ammonia (NH$_3$) as precursors and N$_2$ as a carrier gas at substrate temperature T=650–900° C., V/III ratio=3000, reactor pressure=100 Torr.

A substrate nitridation procedure can include pre-heating the substrates in nitrogen (N$_2$) for 10 min. at 850° C. in an MOCVD reactor, followed by a nitridation step using NH$_3$. The exposure to NH$_3$ can vary, for example, from 30 sec. to 10 min., at a temperature from 650 to 900° C. GaN layers can subsequently be grown on the nitrided substrate surface.

Surface morphology of substrates and films grown in accordance with the subject method were determined by Atomic Force Microscopy (AFM). Chemical composition of the substrates and films was analyzed by Auger Electron Spectroscopy (AES) X-Ray Photoelectron Spectroscopy (ESCA), Secondary Ion Mass Spectroscopy (SIMS) and by Secondary Neutral Mass Spectroscopy (SNMS), while the structural quality was analyzed by Transmission Electron Spectroscopy (TEM). The surface morphology of (001) LiGaO$_2$ substrates as determined by Atomic Force Microscopy (AFM) showed a dramatic improvement after nitridation, and the RMS roughness determined from the measurements is summarized in Table 1.

TABLE 1

RMS surface roughness as a function of NH$_3$ and N$_2$ expose temperature

| Treatment | RMS ($R_g$), nm | N atomic conc., % |
| --- | --- | --- |
| as received | 3.40 | not detected |
| 650° C. (NH$_3$) | 0.58 | 2.49 |
| 800° C. (NH$_3$) | 0.12 | 6.31 |
| 900° C. (NH$_3$) | 0.10 | 8.61 |
| 650° C. (N$_2$) | 3.8 | not detected |
| 800° C. (N$_2$) | 3.6 | not detected |
| 900° C. (N$_2$) | 3.2 | not detected |

For samples treated with ammonia, the surface roughness was observed to significantly decrease while the surface nitrogen concentration increased, as compared with as-received substrates. A distinct $N_{KLL}$ peak was observed on NH$_3$ pretreated surfaces, indicating that nitrogen was incorporated into the LiGaO$_2$ surface layer.

Before nitridation a damaged disordered region about 10–15 nm deep appears to be formed at the LiGaO$_2$ surface. After NH$_3$ treatment the disordered region observed for the as-received LiGaO$_2$ has disappeared. The NH$_3$ treated surface exhibits a high degree of crystalline quality, with an atomically flat surface having steps less than 5 Å observed. Accordingly, nitridation of the LiGaO$_2$ improves surface structure.

Pretreatment in NH$_3$ at 650° C. produced a very rough surface, with apparent three dimensional growth mode. The surface morphology of GaN films grown on (001) LiGaO$_2$ pretreated at 800 and 900° C. are very smooth, consistent with a two dimensional growth mode. Accordingly, the nitrided layer improves the surface morphology of the resulting GaN films.

It appears that nitridation of the LiGaO$_2$ substrate leads to the reconstruction of the substrate surface and to the formation of a thin layer of nitrided material having the same orientation as the substrate. The essential role of nitridation is thought to be the supply of nucleation centers for GaN which have the same orientation as the substrate and the promotion of the growth of high quality GaN films due to the decrease in interfacial free energy between the film and substrate. It also may play a role in preventing Li diffusion from the substrate into the GaN film.

EXAMPLE 1

GaN Growth

Preferably, the surface of a LiGaO$_2$ substrate is treated before the growth of any GaN. This surface preparation step can involve flowing N$_2$ over the surface of the LiGaO$_2$ substrate. For example, a N$_2$ flow of 1.7 L/min can be allowed to flow over the LiGaO$_2$ surface for about 10 minutes, at a temperature of approximately 850° C. Next, a nitridation step can be performed where NH$_3$ and N$_2$ can be allowed to flow over the surface of the LiGaO$_2$ substrate. For example, NH$_3$ of 500 sccm with N$_2$ of 1.35 L/min can be allowed to flow over the surface, at a temperature of approximately 850° C. Improvements to the surface can be achieved over a wide range of temperatures. For example, experiments conducted in the range of 800–900° C. have shown surface improvement. This nitridation of the LiGaO$_2$ surface can smooth the surface, which can promote two dimensional growth of GaN layers subsequently grown on the nitridated LiGaO$_2$ surface. Without the nitridation step the LiGaO$_2$ can tend to promote three dimensional growth of GaN, which can lead to a very rough GaN surface as well as defects in the GaN which is grown. One benefit of the nitridation may be to supply nucleation centers of GaN having the same orientation as the substrate. These nucleation centers can contribute to the promotion of two-dimensional GaN film growth through a decrease in interfacial free energy between the film and substrate. Surface flatness is further improved with increasing exposure to NH$_3$.

In a specific embodiment, an initial GaN film can be grown on the LiGaO$_2$ surface at a temperature of about 850° C., utilizing a main N$_2$ flow rate of 1.35 L/min (total N$_2$ flow rate of 1.7 L/min). During MOVPE, TMG can be combined with NH$_3$ at a preferred temperature range of 150° C.–250° C. During HVPE, HCl can be mixed with trimethylgallium (TMG), or Ga(CH$_3$)$_3$, at a temperature of about 250° C.–500° C., and preferably 300° C.–400° C., to form GaCl and CH$_4$ which are then introduced to the main growth chambers. Growth of the GaN can then be performed, for example, in the temperature range 600° C.–1100° C., preferably in the range 700° C.–1000° C., and more preferably in the range 800° C.–950° C.

EXAMPLE 2

Oxide Substrate Surface Pretreatment

A series of experiments were conducted involving the exposure of the oxide substrates to N$_2$ at various temperatures. It was observed that no apparent surface degradation occurred. Subsequent GaN films grown in $N_2$ on $LiGaO_2$ on 850° C. exhibited excellent surface and crystalline quality. The FWHM of films grown in $N_2$ were more than an order of magnitude lower (<160 arc sec) than those grown in $H_2$.

Pretreatment with $NH_3$ had a significant effect on the quality of the subsequently grown GaN, which were deposited in a low pressure horizontal cold-wall MOCVD reactor with triethylgallium (TEGa) and ammonia ($NH_3$) as precursors and $N_2$ as the carrier gas, at substrate temperature between 650 and 900° C., V/III ratio=3000, and a reactor pressure of 100 Torr. Substrates were preheated in nitrogen ($N_2$) for 10 min at 850° C. before nitridation in the reactor. This was followed by a nitridation step using $NH_3$ (1500 sccm). The exposure to $NH_3$ varied from 30 s to 10 min. Thin GaN layers were grown on the nitrided substrate surface using a growth time of 1 min (estimated thickness 85 to 100 Å). The surface morphology of the pretreated substrate prior to growth was determined by Atomic Force Microscopy (AFM) and the chemical composition analyzed by Auger Electron Spectroscopy (AES). The results are shown in the table below.

RMS surface roughness and N content of treated $LiGaO_2$ surfaces

| Treatment | Rg (nm) | Content (at %) |
|---|---|---|
| as-received | 3.40 | not detected |
| 650° C. ($NH_3$) | 0.58 | 2.49 |
| 800° C. ($NH_3$) | 0.12 | 6.31 |
| 900° C. ($NH_3$) | 0.10 | 8.61 |
| 650° C. ($N_2$) | 3.8 | not detected |
| 800° C. ($N_2$) | 3.6 | not detected |
| 900° C. ($N_2$) | 3.2 | not detected |

X-Ray Photoelectron Spectroscopy (ESCA) spectra for the $NH_3$ treated substrate surfaces showed chemical shifts for the $Ga_{3d}$ peak, suggesting, for example, that Ga—N bonds formed in the near surface regions.

There was also concern that Li diffusion into the GaN film would deteriorate the electrical properties of the material. Using Secondary Neutral Mass Spectrometry (SNMS), Li profiles were measured in the GaN films. The resulting data indicated a significant difference in the value of the lithium diffusion coefficient, depending on the substrate pretreatment. In particular, when the substrate is pretreated with $NH_3$ the lithium diffusion coefficient was very small and, in a specific embodiment, decreased from $(5\pm3)\ 10^{-17}$ to $(6\pm2)\ 10^{-18}$ cm$^2$/sec as the substrate pretreatment time decreased from 10 minutes to 30 seconds.

In order to assess what phases are expected to be formed on the substrate surface, a thermodynamic simulation of the nitridation experiments has been performed using the Thermo-Calc databank (along with the thermochemical data for $LiGaO_2$ evaluated by Dr. A. Davydov). The complex chemical equilibrium involving gaseous and condensed phases at different temperatures, pressures and $NH_3/N_2$ ratios has been computed by minimizing the total Gibbs free energy in the Li—Ga—O—N—H system. Results of this modeling suggest that nitridation of $LiGaO_2$ at temperatures below about 800° C. can lead to the formation of stable GaN, $Li_2O$ and liquid Ga droplets, as well as metastable LiH and LiOH compounds. At higher temperatures formation of the above phases are not thermodynamically favorable and only GaN and $LiGaO_2$ compounds can co-exist with the gas phase.

These predictions support the results of the AES, SIMS analyses of substrates which have undergone nitridation in accordance with the subject invention, which suggests that GaN and other mixed oxides, hydrides and nitrides could be formed in the 50–100 Å surface layer on the (001)$LiGaO_2$ substrate during the nitridation.

There is no evidence of nitrogen incorporation in case of nitrogen pretreatment at the same temperature.

The microstructures of the near surface region of an as-received $LiGaO_2$ substrate and a nitrided $LiGaO_2$ substrate was analyzed by HRTEM. Before nitridation an approximately 10–15 nm deep disordered region was formed at the $LiGaO_2$ surface. High contrast in that region indicated that some degree of stress still remained in the disordered region. After treatment with $NH_3$ the discordered region observed for the as-received $LiGaO_2$ substrate disappeared and the $NH_3$-treated substrate surface exhibited a high degree of crystalline quality. Atomically flat surfaces were observed, with steps of less than 5 Å measured. The lattice images at surface were bent with a higher contrast compared to the $LiGaO_2$ indicating either a change in lattice parameters of the $LiGaO_2$ or formation of another phase. Nitridation of the $LiGaO_2$ can improve surface structure and promote surface reconstruction, and, in particular, the formation of a thin layer of nitrided material having the same orientation as the substrate. In fact, SIMS analysis indicates that GaN forms on the nitrided $LiGaO_2$.

Accordingly, the nitridation of $LiGaO_2$ substrates prior to GaN growth appears to have a positive effect. It is believed that a surface reaction product may be formed that promotes recrystallization of the underlying $LiGaO_2$ and shows a lattice parameter very close to that of GaN. Furthermore, this reaction product may serve as an efficient barrier for Li transport into the GaN. The quality of the GaN grown on the pretreated $LiGaO_2$ substrates was remarkably high. The surfaces were atomically flat, and the bulk microstructure was excellent as judged by Transmission Electron Spectroscopy (TEM) micrographs and HRXRD analysis. Indeed, FWHM's on the order of 25 sec$^{-1}$ were observed.

EXAMPLE 3

GaN Deposition

This example describes a technique for the deposition of gallium nitride which combines the advantages of MOCVD and hydride VPE. In this process, trimethylgallium (TMG) is first reacted with HCl in the source zone of a hot wall reactor to form chlorinated gallium species according to the following reaction:

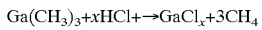

$Ga(CH_3)_3 + xHCl \rightarrow GaCl_x + 3CH_4$

This stream is then combined with $NH_3$ in the downstream mixing zone and passed over a substrate where deposition of GaN occurs by the following reaction:

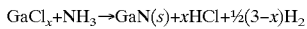

$GaCl_x + NH_3 \rightarrow GaN(s) + xHCl + \frac{1}{2}(3-x)H_2$

The advantages of this technique include a high growth rate (~100 times rates observed in MOCVD), high purity (the Cl retains metal impurities in the vapor phase), and the easy source delivery associated with MOCVD.

The conditions necessary for formation of GaCl from TMGa and HCl were explored. The reaction of TMGa with HCl to produce GaCl was expected to occur within a narrow temperature range, with the upper bound set by the decomposition temperature of TMGa since decomposition before the reaction with HCl might yield liquid gallium wall deposition. Such liquid gallium droplets can form upstream in the growth zone and can restrict the flow of gallium to the water. Also, the flux of gallium might then continue even when the TMG flow is halted, until all of the droplets have evaporated. If the temperature is too low, an adduct compound likely will form between the HCl and TMGa. Furthermore, the formation of gallium trichloride ($GaCl_3$) is thermodynamically favored over the monochloride (GaCl). $GaCl_3$ is a liquid and gives inefficient growth. An important consideration is the location and temperature at which the HCl is mixed with the TMGa stream. It was found that in a temperature range of 250 to 350° C., GaN could be grown at deposition rates on the order of ~40 μm/hr.

Films were grown at temperatures ranging from 450° C. to 975° C., at HCl/Ga ratios from 0 to 12, and at $NH_3$ flows from 100 to 500 sccm. The surface features of films grown at 900° C. included hexagonal pyramids and mesas, as observed on conventional hydride films. The smoothest films had feature sizes of approximately 50 nm, as measured by a stylus profilometer. In contrast, conventional hydride films have reported surface roughnesses on the order of microns. Lateral and longitudinal uniformity were also improved with this deposition technique. The most uniform merged hydride films were uniform to ±3 μm across a 1 cm×1 cm substrate, which is significantly better than the 20% results for conventional hydride films.

The growth rate was measured in the range 500° C. to 950° C. Growth appeared reaction-limited below 750° C., and diffusion-limited above this temperature.

The variation of the growth rate with the HCl/Ga ratio was also studied at 750° C. At an HCl flow rate of zero, the growth rate was low, typical of MOCVD growth. As HCl was added the growth rate increased and proceeded through a maximum near equimolarity, after which it tailed off to zero with high excesses of HCl. This is consistent with thermodynamic predictions and conventional hydride results which demonstrate lower growth rates with increased HCl concentration.

The growth rate was found to be independent of the $NH_3$ flow rate for V/III ratios greater than 100. Qualitatively, films grown with higher $NH_3$ flow rates appeared smoother, and films seemed less prone to thermal cracking with higher $NH_3$ concentrations.

Average values of full width at half maximum (FWHM) for bulk GaN grown in accordance with the subject invention ranged from 100 to 300 arc seconds, with a GaN bulk crystal having a FWHM ω-scan of 46.7 arc seconds.

The best hydride films showed an instrinsic n-type carrier concentration of $1.5 \times 10^{18}/cm^3$ (FTIR), which is consistent with literature results for hydride VPE. Secondary Ion Mass Spectroscopy (SIMS) analysis of both hydride and MOCVD films grown in the merged-hydride reactor showed the presence of Cl, C, and O. Comparative analyses showed that the film grown with the merged hydride technique incorporated more chloride than the standard MOCVD technique, but, more importantly, incorporated less carbon and oxygen.

The merged hydride technique for the chemical vapor deposition of gallium nitride can grow high quality gallium nitride film, and, in particular high quality thick films. Growth rates comparable to conventional hydride VPE have been achieved for single-crystalline film using metal organic reactants. Crystalline quality for as-grown films proved superior to conventional MOCVD for films grown in the same reactor, and comparable to FWHM values found in the literature.

EXAMPLE-4

A HVPE system which was originally designed for growth of GaN films can use gallium chloride (GaCl) and ammonia as the reactants for GaN growth. A schematic diagram of such a reactor is shown in FIG. 1A. Present MOCVD reactors using trimethylgallium (TMG) and $NH_3$ for growing GaN have growth rates of 1 μm/hr or less such that there is no practical way to grow free standing GaN wafers in such slow reactors. In contrast, growth rates in a HVPE machine as shown in FIG. 1A are higher, ranging as high as 200 microns per hour (3–4 microns per minute). Recent results confirm that GaN samples exceeding a millimeter thickness can be grown in several hours using HVPE. In a specific embodiment, TMG rather than liquid gallium as the Ga source can be utilized. Before entering the main reaction zone, the TMG can be mixed with HCl, sustaining the reaction,

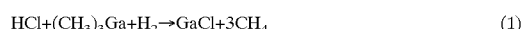

$$HCl+(CH_3)_3Ga+H_2 \rightarrow GaCl+3CH_4 \qquad (1)$$

Preferably, essentially all methyl radicals are immediately converted to methane gas, such that essentially no carbon is incorporated in the GaN film. The subsequent reaction in the main tube can be represented as

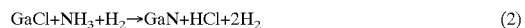

$$GaCl+NH_3+H_2 \rightarrow GaN+HCl+2H_2 \qquad (2)$$

A HVPE system similar to the one shown in FIG. 1A can be operated in the traditional way using hydrogen chloride to transport gallium for reaction with ammonia to form free standing GaN wafers.

Preferably, lithium gallate ($LiGaO_2$) is utilized as the substrate for starting the GaN layer. $LiGaO_2$ is almost perfectly lattice matched to GaN, having lattice parameters a=3.186Å and c=5.007 Å, compared to a=3.189 Å and c=5.185 Å for GaN. Although excellent quality GaN films can be deposited on lattice-matched $LiGaO_2$ substrates at least three potential problems may exist: (1) $LiGaO_2$ may be corroded by hydrogen and HCl; (2) $LiGaO_2$ is not conducting; and (3) Li ions may diffuse from the $LiGaO_2$ substrate into the GaN film, making it highly conducting. In order to overcome these deficiencies, a $LiGaO_2$ substrate can have a thin GaN buffer layer grown on it by MOCVD. Preferably, the $LiGaO_2$ first undergoes nitridation. A GaN layer, for example on the order of 300–400 μm thick, can then be grown by HVPE. The $LiGaO_2$ layer can then be removed by, for example, an HCl etch, resulting in a free standing GaN wafer. Preferably, the GaN wafer can be lifted off of the $LiGaO_2$ layer without the need for etching.

Figure 4:
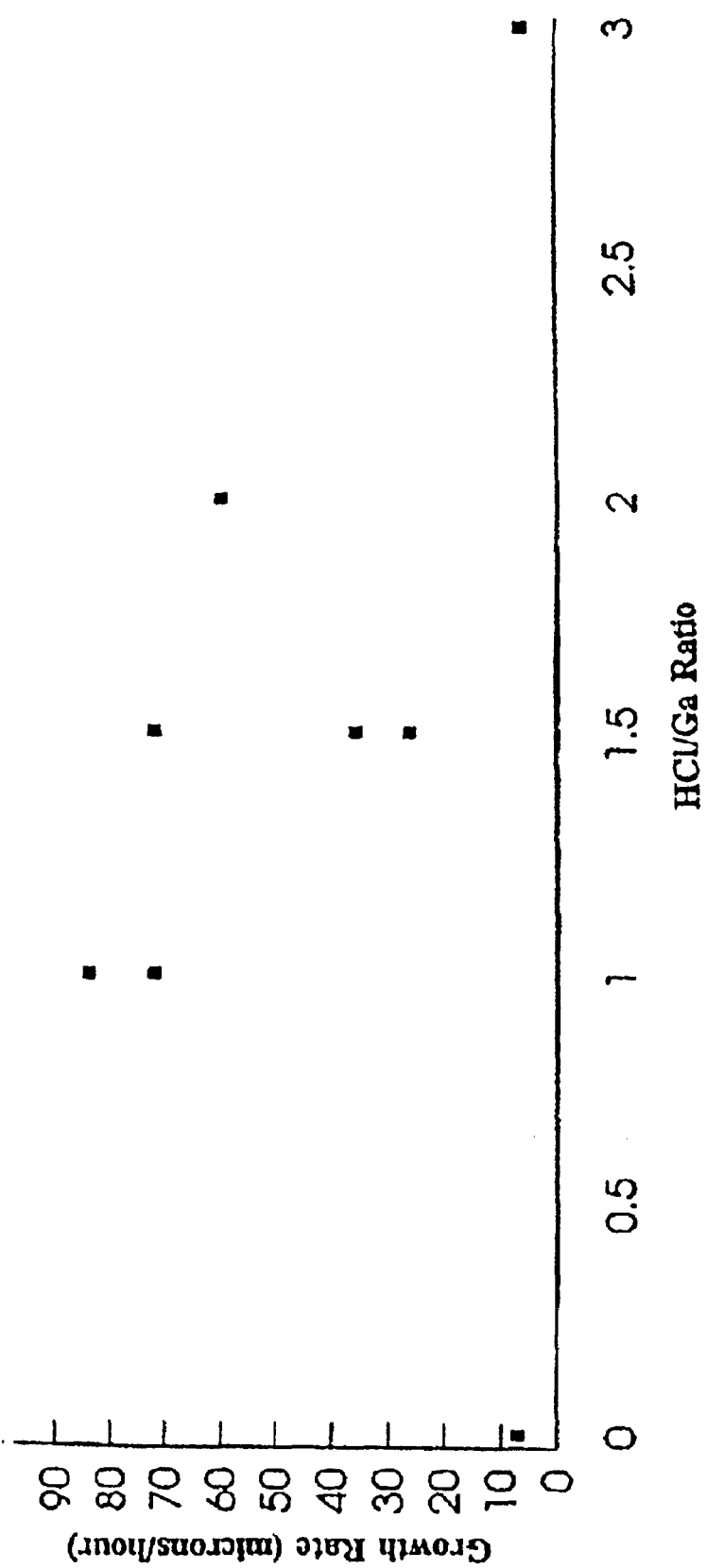
FIG. 4 illustrates the growth rates of GaN on $LiGaO_2$ by HVPE as a function of the HCl/Ga molar ratio, resulting from experiments in accordance with the subject invention.

High growth rates can be obtained when approximately equal molar ratios of HCl and TMG are admitted to the reaction tube. As shown in FIG. 4, growth rates as high as 85 μm/hr were achieved. Excess HCl tends to lower the growth rate since it interferes with reaction (2). Layers of GaN are typically grown at temperatures of 850–900° C., and carrier concentrations in the films are at the level of $1 \times 10^{18}$ $cm^{-3}$. The GaN films are excellent single crystals as shown by the x-ray diffraction pattern in FIG. 2.

$LiGaO_2$ was originally explored in 1965, when the crystal structure was elucidated. $LiGaO_2$ is formed by the substitution of equal concentrations of Li and Ga for Zn in ZnO. The crystal structure is nearly wurtzite (like ZnO), but due to the very small size of the Li ion, the structure is slightly distorted. In order to account for this distortion, $LiGaO_2$ is classified as orthorhombic. $LiGaO_2$ melts around 1600° C., unlike ZnO which decomposes. Crystal Photonis Inc., Sanford, Fla., prepares large crystalline boules of these materials by the Czochralski melt pulling technique. It was found that these melts have a problem with loss of lithium through the evaporation of $Li_2O$. Thus excess $Li_2O$ has to be added to the melts. Boules up to 6 inches long can be grown, featuring 2 inch diameters. Growth rates of at least 2 mm/hour can be achieved, much faster than either SiC or ZnO. These boules can then be cut into wafers, and polished.

The LiGaO$_2$ substrates received from Crystal Photonics were polished on both sides, and had the (001) orientation. The 38 mm diameter wafers were sawed into four equal quarters, or 10×10 mm samples, with a diamond wheel, and cleaned with standard organic solvents prior to being loaded in the growth chamber. We found that attempts to etch the surface of LiGaO$_2$ with common inorganic acids such as HCl quickly ruin the appearance of the surface. Therefore, the wafers were simply loaded into the reaction chamber without further processing.

The samples were heated in flowing nitrogen. Typically, the nitrogen flowrate was maintained at 5 l/min. The gallium source was triethylgallium (TEG), held at 15° C.; the bubbler pressure was held at 740 Torr, with a carrier gas flowrate of 50 sccm. This corresponds to 11.5 μmole/min of TEG. 3 l/min of NH$_3$ were admitted to the chamber. The sample was heated slowly in an inert nitrogen ambient. The growths were performed at 850–870° C. for one hour. After one hour of growth, the reactant gas flows were stopped, and the sample was slowly cooled to room temperature.

GaN films on LiGaO$_2$ substrates grown in accordance with the subject invention were investigated using cross-sectional Transmission Electron Spectroscopy (TEM). One sample had a density of threading dislocations of only $10^7$ cm$^{-2}$ at a distance greater than 0.3 microns from the interface. Densities were about $10^9$ cm$^{-2}$ at the interface. Accordingly, it may be possible to make GaN LEDs by standard GaAs processing techniques because the substrate will be conducting.

The subject invention relates to a method and apparatus, for the deposition of III–V compounds, which can alternate between MOVPE and HVPE, combining the advantages of both. In particular, the subject hybrid reactor can go back and forth between MOVPE and HVPE in situ so that the substrate does not have to be transported between reactor apparatus and, therefore, cooled between the performance of different growth techniques.

EXAMPLE-5

Reactor and Inlet Section Design

Figure 5:
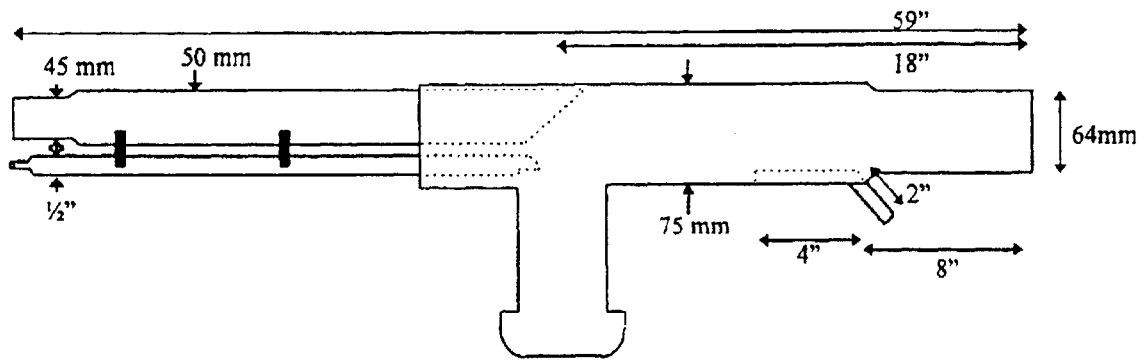
FIG. 5 illustrates schematically a reactor design in accordance with the subject invention.
Figure 6A:
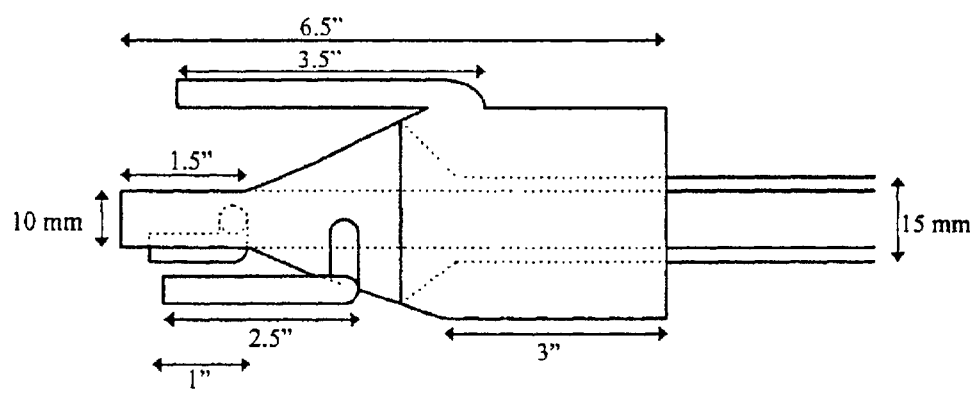
FIG. 6A illustrates schematically an inlet section side view in accordance with the subject invention.
Figure 6B:
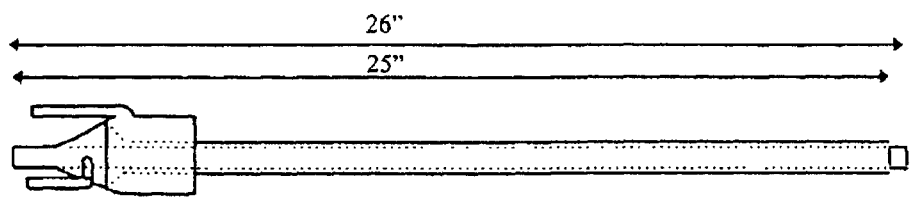
FIG. 6B illustrates schematically an extended view of an inlet section in accordance with the subject invention.

FIGS. 5, 6A, and 6B show schematically portions of a reactor design in accordance with the subject invention. This design can allow planar composition changes throughout the film in two ways. First, it can incorporate dopants by standard MOCVD techniques. Second, it can grow planar heterostructures at high growth rates by adding another metalorganic (such as trimethylaluminum (TMA) or trimethylindium (TMI)) to the reactant stream. Accordingly, two different compositions of film may be alternated with this method.

A reactor design is shown in FIG. 5 and an inlet section is shown in FIGS. 6A and 6B. The reactor is a hot-wall design, housed in a clamshell furnace with six independently controlled temperature zones. Each of the reactor tubes is fabricated from quartz, and all are concentric, with the center tube of the inlet having an adjustable length so that the TMG reaction temperature may be controlled by adjusting either the tube length or the furnace zone temperature. The inlet section is attached to the main reactor tube by a 2-inch Ultratorr fitting.

The substrate can be loaded upon a quartz, sled-like wafer holder, which can then be manually loaded into a Pyrex load lock by means of a forked quartz rod. The load lock can be pumped to rough vacuum and then refilled with nitrogen. The gate valve is opened, and the sled is loaded into the reactor by translating the rod. The rod is drawn back into the load lock and secured. Then the reactor can then be pumped down and purged, for example, three times to desorb any contaminants from the reactor walls. The gate valve is closed, and the wafer is permitted to come to thermal equilibrium under nitrogen. Ammonia flow can be started to the run side of the reactor, and HCl and TMG flows can be started t the vent side. After about 60 seconds of nitridation, the HCl and TMG can be shunted to the run side.

At the end of the growth run, the HCl and TMG can be reshunted to the vent, and then all reactant flows stopped. An exception to this case is made when lithium gallium oxide (LGO) is the substrate being used, in which case NH$_3$ is flowed until the furnace temperature drops below a given value, typically 600° C. The reactor can again be purged with nitrogen for ten minutes, and unless the growth is on LGO, the substrate-bearing wafer holder is removed from the reactor. If the growth is on LGO, the reactor is allowed to cool to room temperature, at which time the film is removed.

Specific flows for single-crystal growth can be as follows:

| Process Flow | Value |
| --- | --- |
| Total flow rate | 2 SLPM |
| Trimethylgallium | 2.3 sccm |
| NH$_3$ | 500 sccm |
| HCl (10% in N$_2$) | 45.3 sccm |
| TMG dilution stream | 300 sccm |

It should be understood that the examples and embodiments described herein are for illustrative purposes only and that various modifications or changes in light thereof will be suggested to persons skilled in the art and are to be included within the spirit and purview of this application and the scope of the appended claims.

What is claimed is:

1. A device, comprising:
   a means for performing metal organic vapor phase epitaxy (MOVPE) on a surface of a substrate; and
   a means for performing hydride vapor phase epitaxy (HVPE) on the surface of the substrate,
   wherein said device can transition form MOVPE to HVPE in situ.

2. The device according to claim 1, wherein the substrate does not have to be removed from the device between MOVPE and HVPE.

3. The device according to claim 2, wherein the substrate can be maintained at elevated temperatures during transition from MOVPE to HVPE.

4. The device according to claim 1, wherein said device can also transition from HVPE to MOVPE in situ.

5. The device according to claim 4, wherein the substrate can be maintained at elevated temperatures during transition from MOVPE to HVPE.

6. The device according to claim 1, wherein said device can be used to grow a III–V nitride compound semiconductor onto the surface of the substrate.

7. The device according to claim 5, wherein said device can be used to grow GaN onto the surface of the substrate.

8. The device according to claim 6, wherein said means for performing HVPE comprises a hot-wall reactor having a source zone, and a downstream mixing zone, wherein TMG can be reached with HCl in the source zone to form a chlorinated gallium species, and wherein the chlorinated gallium species can combine with NH3 in the downstream mixing zone and directed toward the substrate for deposition of GaN onto the substrate via HVPE.

9. A device, comprising:

a means for performing metal organic vapor phase epitaxy (MOVPE) on a surface of a substrate; and a means for performing hydride vapor phase epitaxy (HVPE) on the surface of the substrate, wherein the means for performing metal organic vapor phase epitaxy (MOVPE) on a surface of a substrate comprises a reactor, wherein the means for performing hydride vapor phase epitaxy (HVPE) on the surface of the substrate comprises the reactor, wherein the reader can go back and forth between MOVPE and HVPE in situ.

10. The device according to claim 8, wherein the reactor is a hot-wall reactor.

11. The device according to claim 8, wherein TMG is reacted with HCl according to the following reaction $$Ga(CH_3)_3 + xHCl \rightarrow GaCl_x + 3CH_4.$$

12. The device according to claim 8, wherein growth of GaN occurs according to the following reaction $$GaCl_x + NH_3 \rightarrow GaN + xHCl + \tfrac{1}{2}(3-x)H_2.$$

13. The device according to claim 7, wherein said means for performing MOVPE comprises a hot-wall reactor having a mixing zone, where TMG can be reacted with $NH_3$ in the mixing zone for deposition on GaN onto the substrate via MOVPE.

14. The device according to claim 8, wherein said means for performing MOVPE comprises a hot-wall reactor having a mixing zone, wherein TMG can be reacted with $NH_3$ in the mixing zone for deposition on GaN onto the substrate via MOVPE.

15. The device according to claim 11, wherein the substrate does not have to be moved between MOVPE and HVPE.

* * * * *